United States Patent [19]

Yoshino et al.

[11] Patent Number: 4,951,603
[45] Date of Patent: Aug. 28, 1990

[54] APPARATUS FOR PRODUCING SEMICONDUCTORS

[75] Inventors: Akira Yoshino; Yoshinori Ohmori; Toshiharu Ohnishi, all of Osaka, Japan

[73] Assignee: Daidousanso Co., Ltd., Osaka, Japan

[21] Appl. No.: 243,006

[22] Filed: Sep. 12, 1988

[51] Int. Cl.$^5$ .............................................. C23C 16/00
[52] U.S. Cl. .................................. 118/719; 118/725; 118/728; 118/730; 427/255.5
[58] Field of Search ............... 118/715, 719, 725, 730, 118/729, 728; 427/255.2, 255.5; 414/217, 222; 204/298

[56] References Cited

U.S. PATENT DOCUMENTS

| | | | |
|---|---|---|---|
| 3,306,768 | 2/1967 | Peterson | 427/255.3 |
| 3,652,444 | 2/1972 | Lester et al. | 204/298 |
| 3,915,117 | 10/1975 | Schertler | 118/719 |
| 4,058,430 | 11/1977 | Suntola et al. | 427/255 |
| 4,171,235 | 10/1979 | Fraas et al. | 118/719 |
| 4,226,208 | 10/1980 | Nishida et al. | 118/725 |
| 4,313,783 | 2/1982 | Davies et al. | 118/731 |
| 4,508,054 | 4/1985 | Baumberger et al. | 118/715 |
| 4,542,712 | 9/1985 | Sato et al. | 414/217 |
| 4,810,473 | 3/1989 | Tamura et al. | 118/719 |
| 4,838,201 | 6/1989 | Fraas et al. | 118/719 |

FOREIGN PATENT DOCUMENTS

| | | | |
|---|---|---|---|
| 60-249328 | 12/1985 | Japan | 156/345 |
| 61-106768 | 5/1986 | Japan | 118/715 |

Primary Examiner—Richard Bueker
Assistant Examiner—Terry J. Owens
Attorney, Agent, or Firm—Armstrong, Nikaido, Marmelstein, Kubovcik & Murray

[57] ABSTRACT

Apparatus for continuously producing semiconductor films on substrates in a vacuum chamber. A plurality of reaction chambers are provided within the vacuum chamber, substrates are supported by a top plate and transferred to each reaction chamber, which are filled with a certain reactant gas mixture while the substrates are heated from above the reaction chamber. Continuous treatment of the substrates is provided with an increase in reactant gas utilization efficiency. Disturbance of reactant gas flow by thermal convection is prevented and semiconductor layers having smooth surfaces are formed.

2 Claims, 6 Drawing Sheets

APPARATUS FOR PRODUCING SEMICONDUCTORS

FIELD OF THE INVENTION

This invention relates to an apparatus for producing semiconductors wherein compound semiconductor layers are deposited in a vacuum chamber, in particular in a vacuum chemical epitaxy (VCE) system.

BACKGROUND OF THE INVENTION

In recent years, the demand for compound semiconductors, especially Group III–V compounds (e.g. GaAs), has been growing because of their superior performance characteristics compared to the conventional silicon semiconductors. For the production of such compound semiconductors, there are known, among others, (a) the so-called molecular beam epitaxy (MBE) process which comprises causing atoms, required for a compound to be epitaxially grown, to evaporate from a solid material using a heat gun and causing them to collide, in the molecular beam form, against a substrate in an ultrahigh vacuum to thereby cause growth of a film of said material on said substrate, and (b) the so-called metal organic chemical vapor deposition (MOCVD) process which comprises introducing the vapor of a methyl-metal or ethyl-metal compound into a reaction chamber at atmospheric pressure or under reduced pressure by means of a carrier gas such as $H_2$, allowing said vapor to mix with a Group V metal hydride and allowing the reaction therebetween to take place on a heated substrate for crystal growth.

However, the MBE process has a problem in that it is not suited for large-scale production, hence can hardly meet the needs of the market. The MOCVD process also has a problem in that the reactant gases are expensive and because of the growth mechanism, the efficiency of utilization of reactant gases is low, although the process is higher in production capacity than the above-mentioned MBE process. It is therefore difficult to use the MOCVD process for the production of semiconductors for use in fields other than some special fields where high costs do not matter. Furthermore, since a large quantity of unreacted gas, which is toxic, is produced because the efficiency of reactant gas utilization is low, as mentioned above, and since a carrier gas is used for gasifying and carrying the Group III compound, which has a low vapor pressure, and this constitutes an additional waste gas portion, a toxic waste gas is discharged in large quantities, and this fact leads to waste gas disposal problems. An apparatus so far in use for such a MOCVD process can be schematically illustrated by FIG. 11. Thus, a substrate 3 is mounted on a heater 2 disposed in a vacuum chamber 1, and a gaseous compound mixture for semiconductor deposition is fed toward the substrate 3, in the direction indicated by the arrows A, from a nozzle 4 disposed in the upper part of the vacuum chamber 1. In such an apparatus, the vacuum chamber 1, which has a large capacity, is filled with a gaseous compound (reactant gas) mixture for each treatment run and after treatment, the gaseous compound mixture is discharged as a waste gas. The waste gas contains unreacted gases, which have not been involved in semiconductor deposition, in large quantities and, accordingly, the reactant gas utilization efficiency is low. In the above-mentioned apparatus, the substrate 3 is placed on the heater 2 and heated from the under surface. Thermal convection thus takes place over the substrate, as shown by the arrows B, and heat is dissipated from the substrate 3 heated by the heater 2 to the vicinity of the upper surface of the substrate 3, as shown by the arrows C. As a result, the flow of the gaseous compound mixture fed from the nozzle 4 is disturbed by the forcing-up effect of the above-mentioned thermal convection current (arrows B) and heat dissipated (arrows C), so that uniform film growth on the upper surface of the substrate 3 cannot take place any longer. Therefore, it is a serious disadvantage of the apparatus mentioned above that the semiconductor films produced (semiconductor layers) do not have a smoothly finished surface. This disadvantage is further aggravated by the fact that GaAs particle flags formed by contact and reaction, in the gaseous atmosphere, of the reactants that have failed to arrive at the surface of the substrate 3 due to the abovementioned thermal convection (arrows B) float in the gaseous atmosphere and deposit on the semiconductor film at random. Furthermore, in the above-mentioned apparatus, any change in the type of feed gas is effected by operation of a plurality of valves 5, 6 and 7 for respective gas feeding pipes connected to the above-mentioned nozzle 4. For formation of a plurality of different types semiconductor layers, frequent change-over operation of the valves 5, 6 and 7 is required. This disadvantageously means a low operation efficiency. It is a further problem that the compound or compounds used in the previous series of runs remain in the nozzle 4 and behave as impurities which make it difficult to obtain semiconductors of good quality.

U.S. patent application Ser. No. 941,005 discloses an apparatus for producing semiconductors in a vacuum chemical epitaxy to solve the above-mentioned problems. A substrate is placed in a vacuum chamber. The substrate is heated from its topside. Mixing chambers are disposed in a multistage manner below the substrate. A plurality of reactant gases are supplied toward the substrate from the mixing chambers. However, the above-mentioned apparatus is basically for a batch system production process and unsuitable for a continuous operation. In a specification of the U.S. patent application, it is said that continuous operation is possible but an exact structure for the continuous operation is not disclosed at all.

Accordingly, it is an object of the invention to provide an apparatus for producing good-quality semiconductors having a smooth semiconductor layer surface efficiently by combining the advantages of the MBE process and those of the MOCVD.

SUMMARY OF THE INVENTION

The above object can be accomplished by providing an apparatus for producing semiconductors according to the present invention by dividing a round vacuum chamber, which can be evacuated to a high degree of vacuum, into a plurality of zones along the circumference. A surrounded space for a reaction chamber comprises a base and surrounding walls rising from the circumference of the base in the zones respectively. A rotatable disc is disposed in the round vacuum chamber in the state that the rotatable disc is positioned closely with the top portions of the surrounding walls of the surrounded spaces for the reaction chambers. Parts of the rotating disc corresponding to the surrounded spaces for reaction chambers are formed as top plates with which cover the surrounded spaces for the reaction chambers respectively. The rotatable disc is fixed by a rotatable shaft installed vertically from the center of a floor of the vacuum chamber. Each top plate is fitted with a holding device for holding at least one substrate in the state in which the substrate faces an inner space of the surrounded space. The rotatable disc is rotated by a driving device connected to the rotatable shaft so as to stepwise transfer the substrate from one to other surrounded spaces. The base of the surrounded space is provided with a reactant gas feeding device for feeding reactant gases toward the substrates held on the holding device. Reactant gas exhaust ports are provided on the surrounding walls of the surrounded space or between the surrounding walls and the top plate. A heating device is installed over the top plate of the reaction chamber.

BRIEF DESCRIPTION OF THE DRAWINGS

In the accompanying drawings.

DETAILED DESCRIPTION OF THE INVENTION

In the semiconductor production apparatus according to the invention, the vacuum chamber is evacuated to a high degree of vacuum to increase the mean free path for reactant gas molecules and the gas molecules are allowed to collide against substrates efficiently in the form of molecular beams, and, at the same time, the reactant gases are fed from reactant gas feeding means to the reaction chamber newly provided in the vacuum chamber and smaller in capacity than the vacuum chamber, for semiconductor layer deposition on the substrate placed in the reaction chamber. As a result, the reactant gas utilization efficiency can be greatly increased. Furthermore, semiconductor layers with very good surface smoothness can be formed since the reactant gases fed into the reaction chamber are no longer influenced by thermal convection and because of the construction of the top plate of the apparatus, which is a constituent of the reaction chamber and holds the substrate. The base of the reaction chamber is fitted with the reactant gas feeding means and the heater is located over the top plate of the reaction chamber.

Heating or cooling treatments can be done to the substrates in a certain reaction chamber and in the next reaction chamber, reactant gases can be fed to the substrate because the structure is a vacuum chamber divided into a plurality of independent zones. A reaction chamber is disposed in each zone, and a rotatable disc transfers top plates to be able to stepwise transfer the substrates to the plurality of reaction chambers. Accordingly, it is possible to produce semiconductors continuously and production efficiency can be greatly increased. Since the vacuum chamber is divided into a plurality of independent zones and the reaction chamber is installed in each zone, different kind of reactant gases can be used. Therefore, there is no quality deterioration of the obtained semiconductor which may be caused by contamination of the reactant gas with a different gas or gases as impurities. Furthermore, the vacuum chamber is maintained at a high degree of vacuum and, therefore, even a Group III compound, which is low in vapor pressure, can be gasified there. Consequently, the use of a carrier gas for gasifying and carrying the Group III compound is no longer necessary, and the quantity of waste gas to be treated for disposal becomes minimal.

The following examples will illustrate the invention in more detail.

Figure 1:
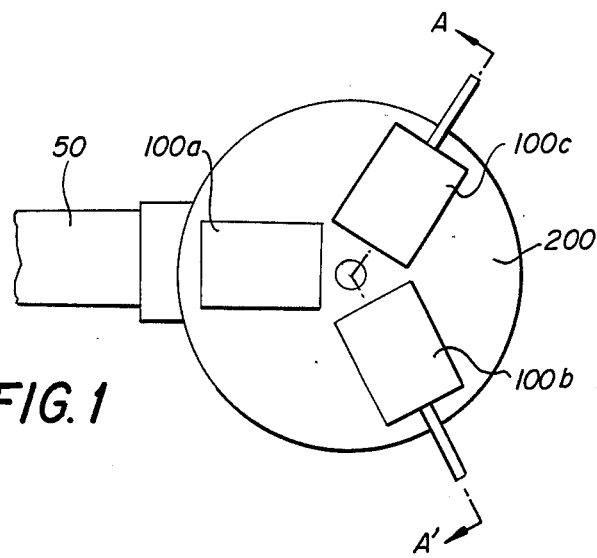
FIG. 1 illustrates, in plan view, an embodiment of the semiconductor production apparatus according to the invention.
Figure 2:
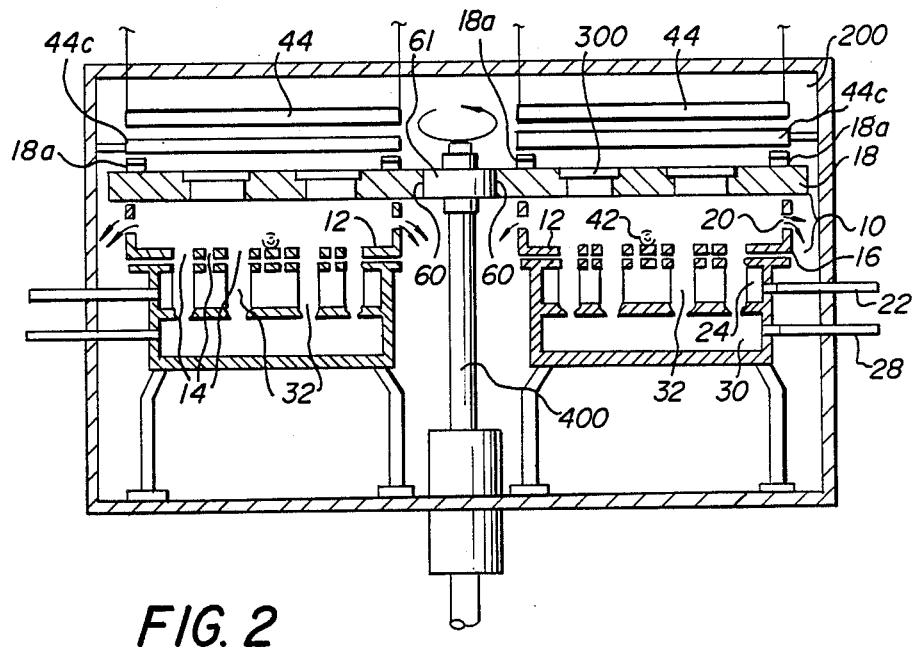
FIG. 2 is a vertical sectional view of the embodiment as seen along line A—A' as shown in FIG. 1.
Figure 4:
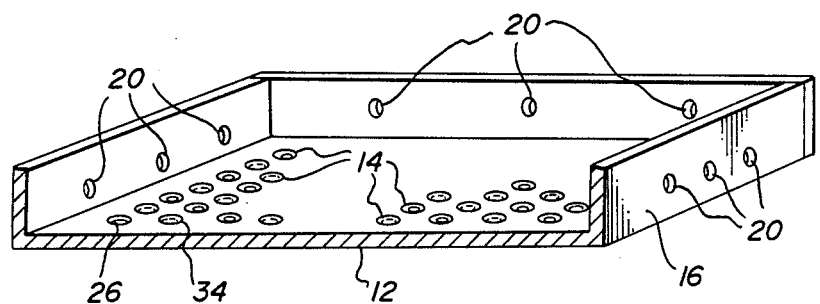
FIG. 4 illustrates, in perspective, the reaction chamber, in the state that the top plate thereof is removed in the embodiment.
Figure 5:
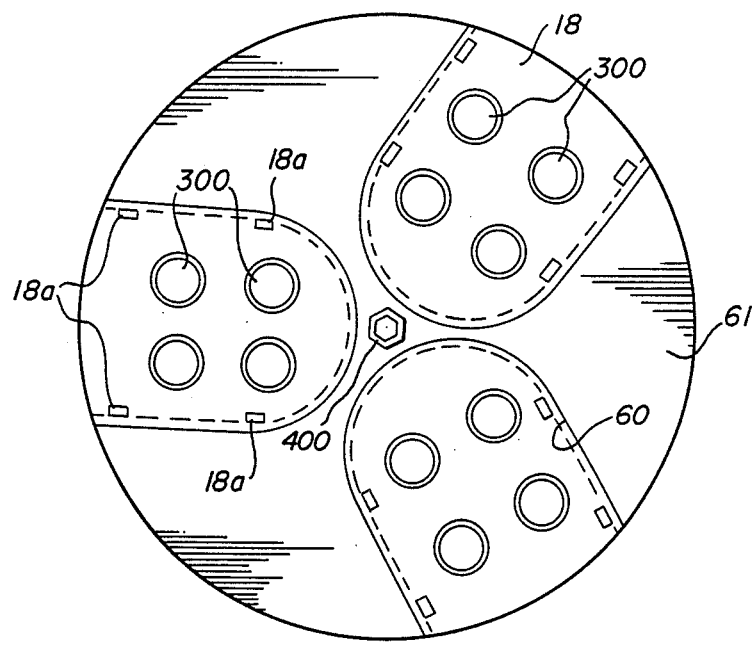
FIG. 5 illustrates, in plan view, the rotating disc block used in the embodiment.
Figure 6:
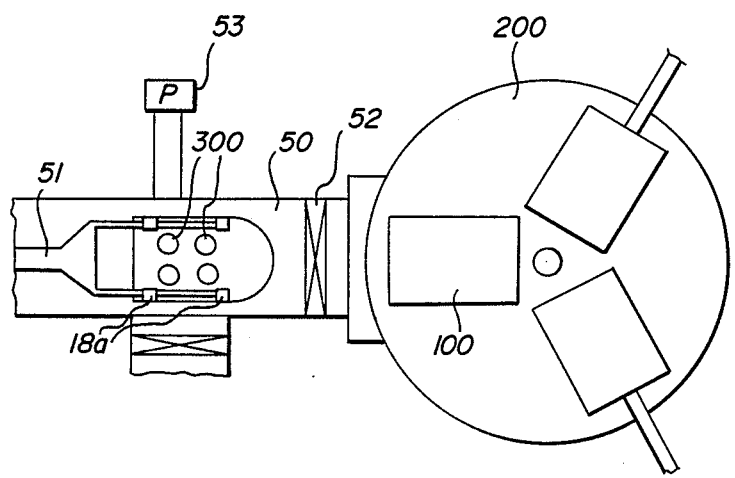
FIG. 6 illustrates, in planar section, the apparatus inclusive of a substrate feeding apparatus.
Figure 7:
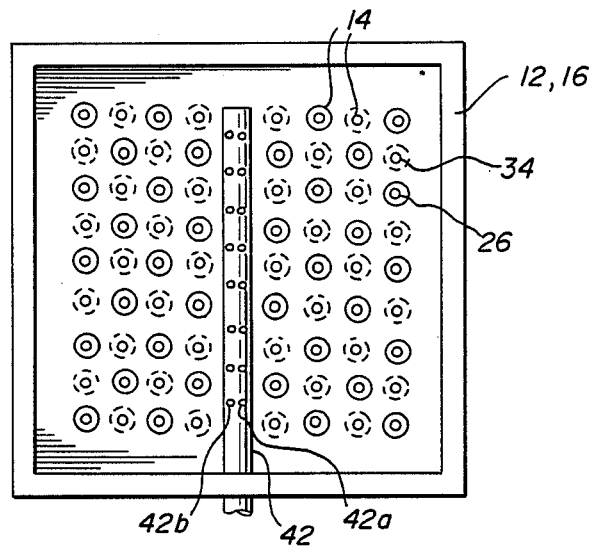
FIG. 7 illustrates, in plan view, the state of distribution of nozzle openings and of feeding pipes in the reaction chamber.
Figure 8:
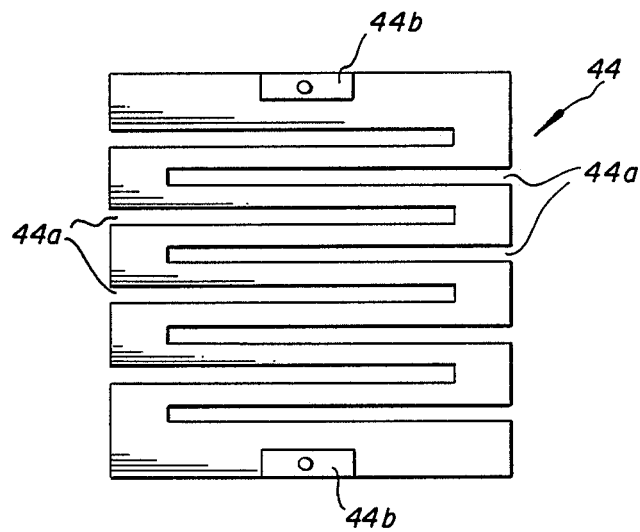
FIG. 8 illustrates, in plan view, the heater used in the embodiment.

FIGS. 1-2 illustrate a semiconductor production apparatus used in an embodiment according to the invention. In these Figures, the reference numeral 200 indicates the round vacuum chamber of a vacuum chemical epitaxy system. The inner part of the round vacuum chamber is divided into three independent zones 100a, 100b and 100c and a reaction chamber is disposed in zones 100a, 100b and 100c. The reaction chamber 10 in the zone 100a, which is close to the substrate exchange chamber 50, is for preheating and cooling the substrate 300. The reaction chamber 10 in the zone 100b serves for undoped layer growth. The reaction chamber 10 in the zone 100c is for n-type active layer growth. Each reaction chamber 10 mentioned above, as illustrated in FIGS. 3 and 4, is formed by a surrounded space comprising a tetragonal base plate 12 and surrounding walls 16 rising from the circumference of the base plate. A top plate 18 is placed at an arch-shaped cut 60 of a rotatable disc 61. Three top plates 18, of a size which is a little smaller than the vacuum chamber 200, are slowly rotated around a rotatable shaft 400, which is positioned at the center of the vacuum chamber 200 and which is connected to a driving means (not illustrated) such as a motor, after each operation run in a manner such that the top plate 18 of one reaction chamber 10 is shifted to the position of the next reaction chamber 10. The above-mentioned arch-shaped cuts 60 are made at parts corresponding to each reaction chamber 10 and as illustrated in FIG. 5, the top plates 18 are detachably mounted or supported thereon by ledges shown by dotted lines. Hooks 18a are disposed at four corner positions of the topside surface of the top plate 18 and are utilized for disposing the top plate 18 to the arch-shaped cut 60. Substrates 300 are mounted detachably on holes formed in said top plate 18 in the state that the surface of the substrates face downward and are supported by holding parts 18a disposed at the circumference of the holes. To illustrate in detail, the top plate is approximately equal in shape to the abovementioned arch-shaped cut 60 and is supported detachably by the supporting part formed on the circumferential edge of the arch-shaped cut 60. The top plate 18 is disposed at the archshaped cut 60, as illustrated in FIG. 6, by lifting up the top plate after fitting a stick-shaped arm of magic hand 51 in hooks 18a of the top plate 18 disposed with the substrates 300. In that state magic hand 51 is extended into a vacuum chamber 200 to place the top plate 18 on the holding part of arch-shaped cut 60 of the rotatable disc 61. After placing the top plate 18, the stick-shaped arm of magic hand 51 goes down to be released from the hook 18a. Then the magic hand 51 goes back to a substrate exchange chamber. Placing and releasing of the top plate 18 is conducted by reversing the above order. In FIG. 6, a valve 52 divides the substrate exchange chamber 50 and the vacuum chamber 200. A vacuum pump 53 evacuates the substrate exchange chamber 50 prior to opening of the valve 52 to a vacuum approximately equal to that in the vacuum chamber 200. The surrounding walls of the reaction chamber 10 have exhaust ports 20 at certain given intervals around the same for discharge of unreacted or excess reactant gas mixture from the reaction chamber into the vacuum chamber 10. The total area of these exhaust ports 20 is preferably about 4% of the surface area of the top plate 18 of the reaction chamber 10. The base plate 12 has spaced discrete nozzle openings 14, which are formed like reverse cones so as to feed the reactant gas uniformly, having a diameter of 3.2 mm, for instance, with the diameter being increased on the upper side, and perforated just below both substrates 300 and at regular intervals (e.g. 25.4 mm). The nozzle openings have a direction perpendicular to the substrates 300 and are in communication with openings 26 or 34 on the ceiling of a first mixing chamber 24 disposed below the reaction chamber 10. As shown in FIG. 7, the openings 26 are disposed alternately with the same number of the openings 34. Each opening 26 is in communication with the first mixing chamber 24, whereas each opening 34 is in communication with a second mixing chamber 30 via a duct 32 which passes through the first mixing chamber 24. The first mixing chamber 24 is in communication with a starting material inlet tube 22 passing through one side wall, as shown in FIG. 2. The starting material inlet tube 22 serves for introducing into the first mixing chamber 24 of a Group III compound (reactant gases) such as trimethylgallium (TMGa) or triethylgallium (TEGa) or of an n-type or p-type dopant either alone or in admixture with such Group III compound. The compound or compounds, after uniform mixing in the first mixing chamber 24, are fed, via the openings 26 and nozzle openings 14, to the reaction chamber in a state of uniform distribution toward the respective substrates 300 positioned above the nozzle openings. The second mixing chamber 30 is in communication, through one side wall thereof, with a starting material inlet tube 28. Through the inlet tube 28, an n-type or p-type dopant or a Group III compound such a triethylaliuminum (TEAl) enters the second mixing chamber 30. The Group III compound, after mixing to a homogeneous state in the second mixing chamber 30 and the ducts 32, enters the reaction chamber in a state of uniform distribution via the openings 34 and the nozzle openings 14 toward the substrates 300. The ducts 32 mentioned above work as the reactant gas flow resistance and give an effect of mixing to serve for improved mixing of reactant gases in the first mixing chamber 24. The whole of the vacuum chamber 200, the rotatable disc 61, the top plates 18 and the first and second mixing chambers 24, 30 are made of a stainless steel and are supported by a stainless steel support member (not illustrated). As shown in FIG. 7, a feeding tube 42 for feeding a Group V compound such as $AsH_3$ to the reaction chamber 10 is disposed on the base plate 12 in a position such that it splits the openings 26 and 34 into equal (in the figure, right and left) halves. The feeding tube 42 has a plurality of holes 42a and 42b at certain definite intervals and in two rows (right and left), whereby the Group V compound can be fed to the reaction chamber 10 (Refer to FIG. 2) in a uniformly distributed state. In FIG. 2, a heater 44 is disposed above the top plate 18 of the reaction chamber 10, with a leveling plate 44c located between the heater and the top plate. The substrates 300 are thus heated mainly by radiant heat, from above, to a temperature sufficient for semiconductor compound deposition on the surface thereof without exposing the forming semiconductor layers to thermal convection and the like influences. As a result, semiconductor layers can deposit on the substrates 300 uniformly. As shown in FIG. 8, the heater 44 may be made by cutting a carbon graphite sheet to make alternate stripe-form cuttings 44a, and fitting the sheet with electrodes 44b on both ends of the sheet. While uniform planar heating is possible with such a heater 44 alone, the use of the heat leveling plate 44c disposed below the heater 44 can make the planar heating more uniform.

Figure 9:
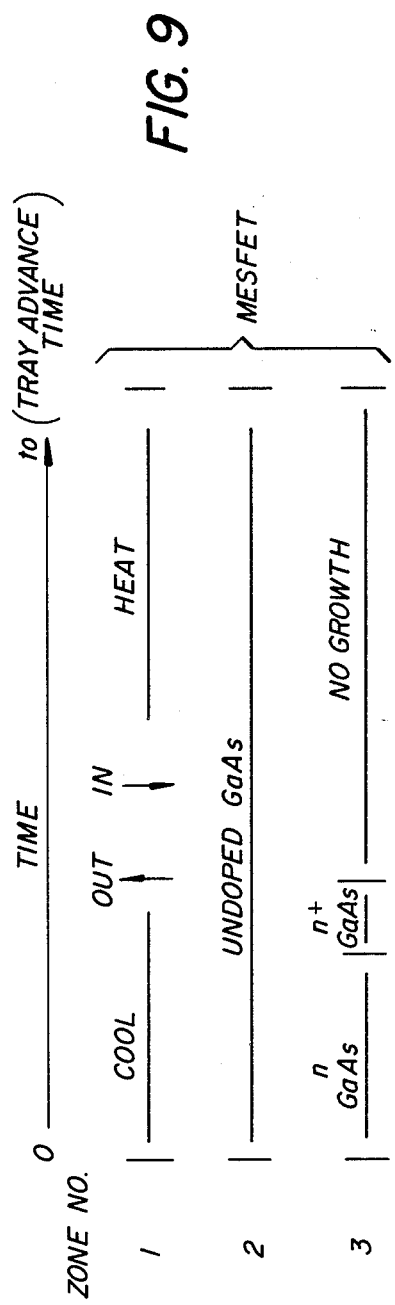
FIG. 9 illustrates a metal semiconductor field effect transistor (MESFET) epitaxy layer deposition process.

In operation, 1152 semiconductors can be produced weekly when four substrates 300 are placed, in the state that the surfaces respectively face downward, on each of the top plates 18 in the zones 100a, 100b and 100c and the apparatus is operated in a two-shift system a day. Referring to FIG. 9 (MESFET epitaxy layer deposition process flowchart) and FIG. 1 & 2, the mode of operation will be described in more detail. First, the vacuum chamber 200 is evacuated to a vacuum at $10^{-7}$ torr and the heater 44 is electrically loaded for heat generation to raise the atmosphere temperature to 650° C. In that state, the top plate 18 with the substrates 300 is mounted on that arch-shaped cut 60 of the rotating disc 61 which corresponds to the first zone by stretching the magic hand 5 from the substrate exchange chamber 50. The substrates 300 are heated there for about 15 minutes and then transferred to the reaction chamber 10 of the second zone 100b by rotating the rotatable disc 61 with the force of a driving apparatus together with the top plate 18 and substrates 300. The top plate 18 having the substrates 300 which all the treatments were finished reaches from the third zone 100c to the first zone 100a by this rotation. Then, after all treatments were done, the substrates 300 from the rotatable disc 61 with the magic hand 51, and another top plate 18 having untreated substrates is placed at the empty space of the disc with the magic hand 51. The following treatments occur by using reactant gases on the substrates 300 of the top plate 18 transferred to second zone 100b. That is, a Group III compound such as trimethylgallium (TMGa) or triethylgallium (TEGa), is fed to the first mixing chamber 24 which is coupled with the reaction chamber 10 of the second zone 100b. The uniformly mixed gas of the Group III compound then enters the reaction chamber in a uniformly distributed state through the nozzle openings 14 toward the substrates 300 positioned at reaction chamber 10 of the second zone 100b. At the same time, a Group V compound such as $AsH_3$ or an alkylarsine, for example triethylarsine (TEAs) is fed to the feeding tube 42 for feeding the compound in excess to the reaction chamber 10 via the holes 42a and 42b. As a result, the Group V compound thus fed to the reaction chamber 10 flows, together with the above mentioned Group III compound (and so forth), dispersedly along the surface of the substrates 300 toward the exhaust ports 20. During the flow, AsH$_3$ or TEAs is thermally decomposed to give As$_2$, which, together with gallium from the above-mentioned gallium compound, comes into contact with the surface of the substrates 300 and deposits on the surface in the form of an undoped gallium arsenide (GaAs) layer or the like. The unreacted compounds that have not come into contact with the substrates 300 leave the reaction chamber via the exhaust ports 20 and enter the vacuum chamber, which they then leave laterally under the action of an exhaust means. It is preferable to allow deposition of the above-mentioned GaAs layer at a growth rate of about 2 um per hour and to a thickness of about $10^4$ Å. In this case, the concentration of impurity portion in the undoped GaAs layer should preferably be not higher than $1 \times 10^{15}$ atoms per square centimeter. After the above treatment, the substrates 300, together with the top plate 18, are transferred from the second zone 100$b$ to the reaction chamber 10 of the third zone 100$c$ by the rotation of the rotatable disc 61. By this rotation, the substrates 300, which had a heating treatment in the first zone 100$a$ reach the second zone 100$b$. On the other hand, the doping treatment is conducted to the substrates 300 transferred to the third zone 100$c$. That is, an n-type dopant with the Group III compound is fed to the reaction chamber 24 or the n-type dopant alone is fed to the reaction chamber 10 from the second mixing chamber 30 so that an n-type dopant alone is fed to the reaction chamber 10 from the second mixing chamber 30 so that an n-type active layer can deposit on the surface of the undoped GaAs layer. This n-type active layer is preferably caused to deposit at a growth rate of about 2 $\mu$m per hour and to a thickness of about $2 \times 10^3$ Å. A suitable n-type dopant concentration in the active layer is about $2 \times 10^{17}$ atoms per square centimeter. Thereafter, all the gas such as Group III compound and so forth supplies are discontinued and the system is maintained in that state for about 15 minutes. Then, the substrates 300 to which the above-mentioned treatments are conducted are returned to the reaction chamber 10 of the first zone 100$a$ by rotating the disc 61 and cooled there. By the rotation of the disc 61, the substrates 300, on which undoped GaAs layer is deposited in the second zone 100$b$ reach the third zone 100$c$ to conduct the doping treatment. After cooling in the first zone 100$a$, the substrates 300 are taken out therefrom together with the top plate 18 by means of the magic hand 51. This apparatus can produce semiconductors continuously by repeating the above series of operations. In this case, the above treatments are performed simultaneously in the corresponding reaction chambers 10. The time required for such a series of treatments amounts to 1.5 hours, made up as follows: about 15 minutes each for heating and cooling in the first zone 100$a$, about 30 minutes for undoped layer growth in the second zone 100$b$, and about 15 minutes for n-type active layer growth and about 15 minutes of a no growth" period (without feeding of a gaseous compound) in the third zone 100$c$. Therefore, 1.5 hours are required for processing twelve substrates 300. Hence, when the apparatus is operated continuously by working in two shifts a day, it can produce 1152 semiconductors weekly.

Figure 3:
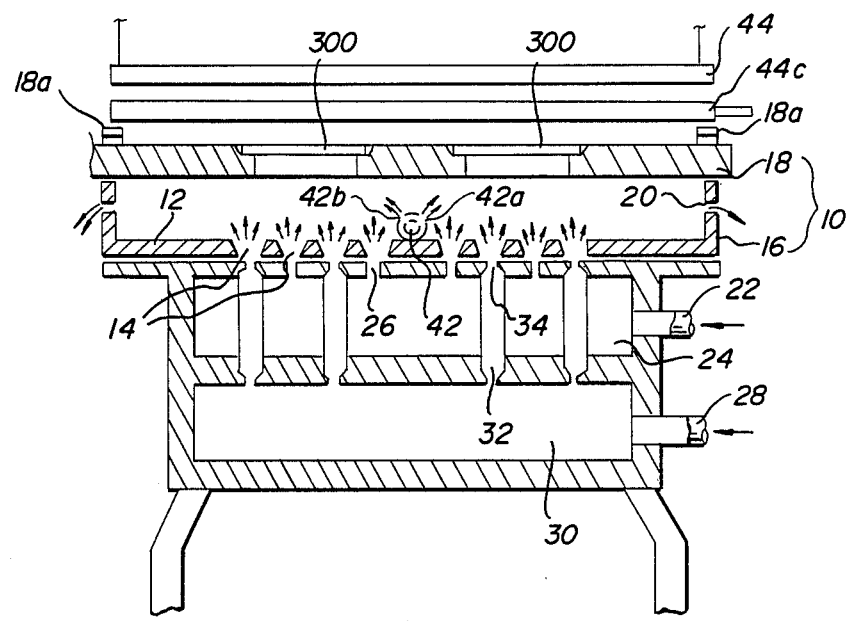
FIG. 3 illustrates, in vertical view, the reaction chamber block used in the embodiment.
Figure 10:
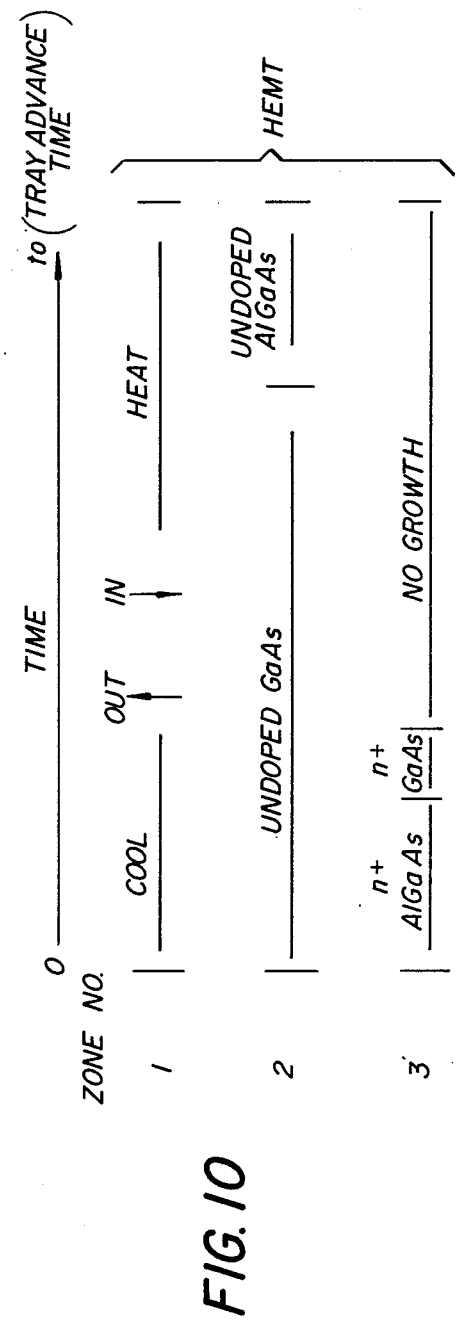
FIG. 10 illustrates a high electron mobility transistor (HEMT) epitaxy layer deposition process.
Figure 11:
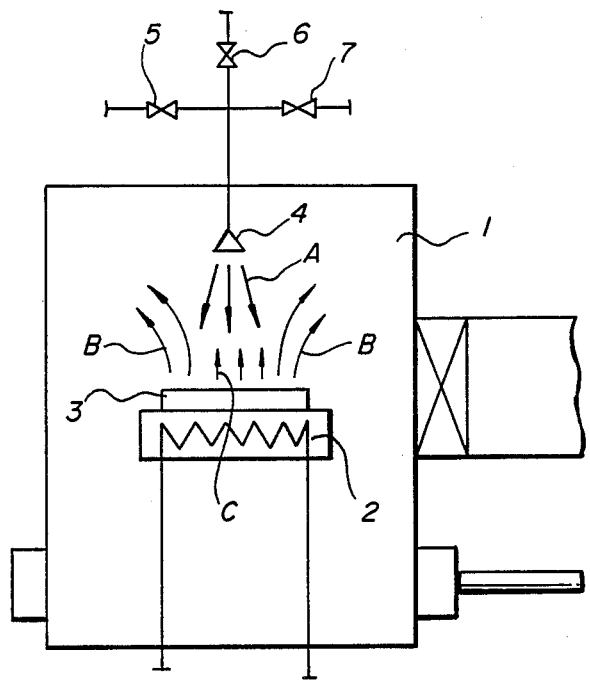
FIG. 11 illustrates, in cross section, a conventional apparatus.

FIG. 10 shows a HEMT epitaxy layer deposition process flowchart. According to this chart, HEMT epitaxy layers can be grown in the second and third zones 100$b$ and 100$c$ by feeding, in the same manner as mentioned above, an Al-containing Group III compound, such, as triethylaluminum, from the second mixing chamber 30 (FIG. 3). In this case, the substrates 300 are first heated in the first zone 100$a$ in the same manner as mentioned above. Then, in the second zone 100$b$, a GaAs layer having a dopant concentration of not more than $1 \times 10^{15}$ atoms per square centimeter and a thickness of about $10^4$ Å is caused to deposit by using gaseous Group III and Group V compounds and, further, an undoped Al$_z$Ga$_{l-z}$As layer is caused to deposit on the above-mentioned GaAs layer to a thickness of 30–100 Å by feeding an Al-containing compound from the second mixing chamber 30 in addition to the above-mentioned gas. In the third zone 100$c$, an n-type dopant is fed in addition to the above-mentioned gas for causing an n$^+$-type Al$_z$Ga$_{l-z}$As layer to grow on the above-mentioned Al$_z$Ga$_{l-z}$As layer to a thickness of 500 Å. In that case, the number z has a value of 0.1–0.9, preferably 0.2–0.3. Then, the exhaust valve (not shown) installed with a starting material inlet tube 28 for the second mixing chamber 30 is closed and the feeding of the Al containing compound alone among the gas components is discontinued, so that an n-type GaAs layer containing the n-type dopant is caused to deposit to a thickness of about $10^3$ Å. Thereafter, in the same manner as mentioned above, the substrates 300 having a semiconductor layer formed thereon are cooled in the first zone 100$a$, taken out of the semiconductor production apparatus and fitted with signal source electrodes and so forth. In this way, HEMT semiconductors can be produced. The time required in this case is substantially the same as mentioned above.

In the apparatus mentioned above, the distance from the nozzle openings 14 to the substrates 300 is adjusted such that the distance is shorter than the mean free path (average distance traveled by a gas molecule until it collides with another molecule) for gas molecules of the Group III compound in a vacuum state and the state of dispersion of the compounds over the surface of the substrates 300 can become uniform. In particular, the substrates 300 are disposed at positions where the circles formed at the ends of the inverse cones, which disperse upward the Group III compound and so forth, fed from the nozzle openings 14, intersect with one another and where the distribution state of gas molecules arriving at the substrates 300 and the collision velocity thereof are sufficient for deposition of the gas molecules on the surface of the substrates 300 at an appropriate rate. Alternatively, the vacuum in the vacuum chamber 200, the rate of feeding of the gaseous compound or compounds and/or the number, diameter and/or some other factor of the openings 26 and 34 and/or the nozzle openings 14 are adjusted depending on the predetermined fixed distance between the nozzle openings 14 and the substrates 300. Measures should be taken so that semiconductor layers having a thickness within the range of a specified thickness ± 5%, more preferably within the range of a specified thickness ± 1%, can be obtained. Generally, the higher the temperature of the substrates 300, the more quickly the reaction proceeds in the formation of GaAs from TEGa and AsH$_3$, for instance. However, when the substrate temperature is excessively high, the material is re-evaporated from layers once formed, whereby the layer growth rate is decreased. Therefore, the temperature of the substrates 300 should preferably be adjusted within the range of 500°-700° C., more preferably 600°-650° C. The vacuum condition in the reaction chamber 10 should preferably be less than $10^{-6}$ torr. When the deposition area is expressed as A and the area of exhaust ports 20 as a, this area a of exhaust ports 20 should preferably amount to about 4% of the growth area. When the area a exceeds 4% of A, the Group V compound is exhausted excessively, whereby the distribution state within the reaction chamber 10 becomes no more uniform. As a result, the uniformity of the semiconductor layers obtained will be inferior. When the a/A ratio is below 4%, the flow of the Group V compound from within the reaction chamber 10 to the exterior becomes worse and the efficiency of utilization of the Group III compound is decreased. As a result, efficient semiconductor layer growth will not be effected any longer. Furthermore, the pressure variation across the reaction chamber 10 should preferably be not more than about 25%. The group V compound should preferably be supplied in sufficient excess to render this pressure variation within the reaction chamber 10 insignificant. Even in that case, the consumption of the Group V compound can be reduced to about 1/20 as compared with the conventional MOCVD process.

As mentioned above, this apparatus for continuous production of semiconductors can perform different treatments in a continuous manner while transferring stepwise the substrates 300 to the reaction chamber 10 disposed in each of the three zones 100a, 100b and 100c resulting from division of the vacuum chamber 200 into three parts. Therefore, it can produce semiconductors very efficiently. Since each zone 100a, 100b, and 100c has its reaction chamber 10 and the substrates 300 are treated in the reaction chamber 10, the reactant gases can be used effectively and, furthermore, different compounds may be used in the respective reaction chambers 10 in the zones 100a, 100b and 100c. Thus, the efficiency of reactant gas utilization can be improved and quality deterioration of semiconductor layers which may be caused by contamination of a compound with a different compound or compounds such as impurities can be avoided or prevented. In addition, in the abovementioned apparatus, since the rate of compound flow within the reaction chamber is rendered constant as a result of exhausting the unreacted gaseous compounds from the reaction chamber 10 via the exhaust ports 20 and since the feed tube 42 is disposed in a position which splits a plurality of nozzle openings 14, which are in communication with the mixing chambers 24 and 30, into equal halves, the Group V compound and so on can be fed to the surface of the substrates 300 in a uniformly mixed state, so that semiconductor layers of a Group III-V compound can be deposited uniformly. The fact that no carrier gas is used minimizes the gas quantity required and this also facilitates the waste disposal treatment.

In the above embodiment, it is also possible that each reaction chamber 10 have a cylindrical form and accordingly each top plate 18 have the corresponding circular form and that the top plates each can move rotatedly around the central axis of the reaction chamber 10 system. This makes it easy to attain increased uniformity of semiconductor layers. While three reaction chambers 10 of the same geometry are used in the above embodiment, it is also possible to fabricate multilayer semiconductors by adding an additional reaction chamber or chambers and accordingly increasing the number of treatment steps. It is further possible to perform heating and cooling in separate chambers. The transfer of the substrate 300 to the next reaction chamber can be conducted not only by rotating the rotatable disc 61 with the top plates 18 mounted thereon, as in the above embodiment, but also by any other adequate means. Furthermore, in one of several possible modifications, the reaction chamber 10 for use in the first zone 100a may be lacking in nozzles and the like but capable of heating or cooling alone, while the reaction chambers for use in the remaining zones 100b and 100c may have only one mixing chamber or three mixing chambers (when an additional mixing chamber is added below the second mixing chamber) depending on the treatments to be performed there. In the above embodiment, exhaust ports 20 are disposed on the surrounding walls 16 of the reaction chambers 10. It is possible to dispose them between the surrounding walls and the top plate not on the walls. While in the embodiment, the mixing chambers 24 and 30 are separated from each other and serve for feeding different starting material gases to the reaction chamber 10 via the nozzle openings 14 in communication with the respective mixing chambers, it is also possible to bring the mixing chambers 24 and 30 into communication with each other by means of holes or the like so that the starting material gases supplied from the starting material inlets 22 and 28 can be mixed in the mixing chamber 24 and then fed to the reaction chamber 10. It is further possible to provide the mixing chamber or chambers with a cooling jacket or the like to thereby cool the gaseous compound or compounds to an appropriate temperature by supplying cooling water to the jacket or the like. This serves for preventing excessive temperature rises in the gaseous compound or compounds and premature reactions of the compounds.

In the apparatus in the foregoing embodiment, the vacuum chamber 200 is divided into three zones 100a, 100b and 100c and the substrates 300 are transferred stepwise to the reaction chambers 10 disposed in each zone 100a, 100b and 100c to make it possible to do the different kind of treatments to the substrates 300 continuously. This means the production efficiency becomes very high. The apparatus has two mixing chambers 24 and 30 for each reaction chamber 10 and therefore can be used in a variety of modes because a plurality of different compounds can be fed through the respective nozzles. Furthermore, since the substrates 300 are heated from above by means of the heater 44 disposed over the top plate 18 while the gaseous compounds for semiconductor deposition are fed to the substrates 300 from below, adequate treatments can be realized and efficient deposition of good-quality semiconductor layers can be caused without any influence due to convectional gas flow resulting from heat generation by the heater 44. In addition, since the rate of compound flow within the reaction chamber is rendered constant as a result of exhaustion of unreacted gaseous compounds from the reaction chamber 10 via the exhaust ports 20 and since the feed tube 4 is disposed in a position which splits a plurality of nozzle openings 14, which are in communication with the mixing chambers 24 and 30, into equal halves, the Group V compound and so on can be fed to the surface of the substrates 300 in a uniformly mixed state, so that semiconductor layers of a Group III-V compound can be deposited uniformly. The use of TEAs, which is relatively low in toxicity, as the Group V compound can facilitate postreaction treatment thereof for disposal. The fact that no carrier gas is used minimizes the gas quantity required and this also facilitates the waste disposal treatment.

We claim:

1. Apparatus for producing semiconductors comprising:
   a vacuum chamber,
   a vertical shaft rotatably mounted in said vacuum chamber,
   a disc supported by and rotatable with said vertical shaft,
   a plurality of reaction zones located adjacent one another and around said vertical shaft, each said reaction zone including a reaction chamber comprised of a base, walls rising from a perimeter of said base and defining the side enclosures of said reaction chamber and a top plate, each of said top plates comprising a part of said disc positioned close to a top portion of said walls and including means for holding at least one substrate in a position facing the interior of each of said reaction chambers and spaced lifting means adapted to slidably receive a pair of rods,
   means for rotating said vertical shaft and disc to sequentially transfer each of said top plates holding at least one substrate from one to an adjacent one of said reaction zones,
   said base of at least one of said reaction chambers including a plurality of spaced discrete openings for uniformly feeding reactant gases toward the substrate holding top plate,
   a plurality of reactant gas exhaust ports provided in each reaction chamber between said base and said top plate,
   heating means above the top plate of each reaction chamber,
   an access opening to the interior of said vacuum chamber, and a lift member having two spaced rods adapted for insertion in said spaced lifting means and movable to lift and lower a top plate and to move a top plate through said access opening.

2. Apparatus for producing semiconductors comprising:
   a vacuum chamber,
   a vertical shaft rotatably mounted in said vacuum chamber,
   a disc supported by and rotatable with said vertical shaft,
   a plurality of arch-shaped cuts around the periphery of said disc,
   a plurality of reaction zones located adjacent one another and around said vertical shaft, each said reaction zone including a reaction chamber comprised of a base, walls rising from a perimeter of said base and defining the side enclosures of said reaction chamber and a top plate, each of said top plates having a peripheral part shaped in a form complimentary to one of said archshaped cuts, means for supporting each of said top plates in one of said arch-shaped cuts of said disc close to a top portion of said walls, each of said top plates including means for holding at least one substrate in a position facing the interior of each of said reaction chambers.
   means for rotating said vertical shaft and disc to sequentially transfer each of said top plates holding at least one substrate from one to an adjacent one of said reaction zones,
   said base of at least one of said reaction chambers including openings for feeding reactant gases toward the substrate holding top plate,
   a plurality of reactant gas exhaust ports provided in each reaction chamber between said base and said top plate,
   heating means above the top plate of each reaction chamber,
   an access opening to the interior of said vacuum chamber, said access opening being through a sidewall of said vacuum chamber adjacent one of said reaction zones, and
   valve means for opening and closing said access opening,
   whereby one of said top plates may be withdrawn from one of said arch-shaped cuts of said disc in said reaction zone and replaced by another top plate when said valve is open to permit access to said reaction zone adjacent said opening.

* * * * *